(12) United States Patent
Misewich et al.

(10) Patent No.: US 6,365,913 B1
(45) Date of Patent: Apr. 2, 2002

(54) DUAL GATE FIELD EFFECT TRANSISTOR UTILIZING MOTT TRANSITION MATERIALS

(75) Inventors: James Anthony Misewich, Peekskill; Alejandro Gabriel Schrott, New York, both of NY (US); Bruce Albert Scott, Tisbury, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/443,746

(22) Filed: Nov. 19, 1999

(51) Int. Cl.[7] .................. H01L 19/12; H01L 31/119; H01L 31/062; H01L 29/76; H01L 29/94; H01L 31/113
(52) U.S. Cl. .................. 257/43; 257/410; 257/289
(58) Field of Search ................ 257/410–414, 257/382–384, 289, 38–39, 40, 43, 344; 438/85, 86, 104, 300–305

(56) References Cited

U.S. PATENT DOCUMENTS 6,121,642 A * 9/2000 Newns .................. 257/192
6,259,114 B1 * 7/2001 Misewich et al. .......... 257/43

FOREIGN PATENT DOCUMENTS

| JP | 2000294796 A | * 10/2000 |
| JP | 2000332133 A | * 11/2000 |

OTHER PUBLICATIONS

Mott transition field effect transistor D.M. Newns Applied Physics letters vol. 73 No. 6 pp. 780–782, Aug. 10, 1998.*

* cited by examiner

Primary Examiner—Tom Thomas
Assistant Examiner—Cuong Quang Nguyen
(74) Attorney, Agent, or Firm—Thomas A. Beck; Marian Underweiser

(57) ABSTRACT

A Field effect transistor semiconductor switch in which the channel of same is made from materials having an electrical conductivity which can undergo an insulator-metal transistor (i.e., Mott transition) upon application of an electric field. The channel contains the Mott material in which the charge carriers, either holes or electrons, are strongly correlated. The Mott transition determines the metal-insulator switching and is demonstrated to be controlled by an external gate electrode.

40 Claims, 5 Drawing Sheets

DUAL GATE FIELD EFFECT TRANSISTOR UTILIZING MOTT TRANSITION MATERIALS

BACKGROUND OF THE INVENTION

1. Field of the Invention

The present invention relates to semiconductor switches, particularly to the field effect transistor (FET) type, which are based upon the Mott metal-insulator phenomenon.

2. Brief Description of the Prior Art

Existing computer circuits, both logic and dynamic random memory (DRAM) are dominated by field effect transistors (FET). FETs have been more widely used lately. Of these, the metal oxide field effect semiconductors MOSFETS (metal oxide semiconductor field effect transistors) have been the leading choice of designers. In this type of transistor, a conducting channel of either electrons or holes is established between two regions, called "source" and "drain" to which ohmic low resistance contacts are made. Control of the "source" current to the "drain" current is achieved by applying a potential to the gate electrode, which affects the width of the conducting channel and/or the number of mobile carriers in the channel. Power gain is achieved between the gate source input terminal and the drain source output because of the high input impedance.

A bipolar junction transistor is formed using three doped semiconductor regions separated by two PN junctions. The device is called a bipolar junction transistor (BJT) because the current flow involves carriers of both polarities (holes and electrons). A BJT can be fabricated either as a PNP transistor or a NPN transistor. The central region is called the base. One of the junctions is forward-biased and is called the emitter-base junction. The other junction is reverse biased and is called the collector-base junction. The three terminals are referred to as emitter, base and collector terminals. The regions are doped either lightly or heavily depending upon the use to which the BJT is to be put.

The FET has an extremely high input impedance as noted above, and has a better frequency response than the BJT. The small signal gain of a FET is not as high as that of a BJT; however the FET is a good alternative to the BJT in those areas of application where high impedance and a better frequency response is required. FETs can also be used as constant current sources and voltage controlled resistors in certain special applications. The important areas of use of FETs are digital circuits and systems.

In general, the basic structure of a FET has a main body which is a single continuous length of N-type semiconductor material. However, there is a small section of P-type material placed on either side of the main N-type section. Both of these P-type sections are connected together electrically. The lead connected to these sections is the gate. The other two leads (source and drain) are connected to either end of the N-type material piece.

The semiconductor channel is backed by a substrate of the opposite type of semiconductor. For example, if the channel is made up of an N-type semiconductor, a P-type semiconductor is used as the substrate. MOSFETs are also characterized as depletion or enhancement mode FETs. Depletion mode FETs reduce the current flow by increasing the negative voltage applied to the gate (assuming an N-type channel). In enhancement mode FETs, assuming an N-channel device, a positive voltage is applied between the gate and the source. The higher the value of the voltage, the greater the number of holes drawn from the N-type source into the P-type substrate. These holes then traverse into the N-type region, drawn by the voltage applied between the drain and the source. Thus increasing the voltage on the gate, results in an increase in the channel current (i.e., the current from source to the drain).

The MOSFET is approaching the intrinsic physical limits in channel length, due to, inter alia, doping and double depletion effects. Thus the exponential increase in circuit density on a chip predicted by Moore's Law is not expected to be maintained by Si based devices. The concept of exploiting the Mott metal-insulator transition to make a FET-like switching device which allows functionality for channel lengths on the scale of 10 nm is known. The approach used herein is to replace the silicon channel by a layer of Mott insulator material. The present invention relates to a FET using oxide materials said FET operating at room temperature.

A non Si-based structure similar to that of the present invention has been explored in the literature in the work on "Superconducting FET" (SuFETS) such as are described in J. Mannhart, J. G. Bednorz, K. Muller and D. G. Schlom, Z. Phys. 13 Condensed Matter, 83, 307 (1991); A. Levy, J. P. Falck, M. A. Kastner and R. J. Birgeneau, Phys. Rev. B 51, 648 (1995); E. H. Taheri, J. W. Cochrane and G. J. Russell, J Appl. Phys., 77 761, (1995); J. Mannhart, Supercond. Sci. Technol. 9, 49, (1996) and references cited in each, the contents of which are all incorporated by reference herein.

The typical SuFET device comprises a channel of superconducting material, (such as fully oxygenated YBCO in the superconducting state) with source and drain contacts on the superconducting material, a gate insulator (such as strontium nitrate) and a gate electrode. In the most common implementation of the SUFET as disclosed in the references noted above, the device is operated near the superconducting transition temperature and a gate field is applied to induce a transition from a superconducting state to an insulating state. A fundamental difficulty with such SUFET devices is the extremely short electric field screening length of superconducting materials which limits the ability of the gate field to modulate the bulk of the channel.

There have also been attempts (e.g., See Taheri, et al. above) to induce superconductivity in an initially insulating channel by applying a gate electric field. This approach is difficult because of the extremely high fields needed to induce a sufficient density of carriers in the channel to undergo insulator superconductor transition. It must be kept in mind however, that this work has been aimed entirely on attempts to take a device with a channel which can undergo a transition between superconducting and insulating states in the channel, and therefore it must be operated at a temperature near the superconducting transition temperature. The present invention is distinct in that a metal insulator transition is utilized in oxide materials to make a device which can operate at room temperature, without the need for the superconducting state.

To more specifically describe the typical prior art enhancement mode FET that uses an oxide channel, reference is made to FIG. 1. Enhancement mode oxide channel FET 100 has a source electrode 101, drain electrode 102, gate electrode 103, gate insulator 104 and channel 105.

It is well known that copper compounds, specifically, cuprates, form a class of materials which demonstrate Mott metal insulator transition. This property makes cuprates suitable for use as the molecular layer in the transistor. In addition, cuprates are well suited for integration with high dielectric oxides such as strontium titanate ($SrTiO_3$) and ($Ba_{1-x}$, $Sr_x$, $TiO_3$), which are all materials suitable as the material used to comprise gate insulator 104.

In cuprate conductors, the conduction band is formed from well-defined atomic or molecular orbitals. In a cuprate semiconductor for example, this role is the result of $d_{x2-y2}$ symmetry orbitals on the Cu sites. In another example, $K_nC_{60}$, the threefold degenerate set of lowest unoccupied molecular orbitals (LUMO) of $C_{60}$ play an analogous role. The simplest model to describe such materials is the Hubbard model described by J. Hubbard, in *Proc. Roy. Sci.* (London) A276, 238(1963); A277, 237(1963); A281, 401 (1963) which are incorporated by reference herein.

In an essentially ordered system, such as a cuprate $CuO_2$ plane, there are found to be two possible global states of the system: insulator and metal. These states are separated by the Mott Transition as described by N. Mott in *Metal Insulator Transitions*, Taylor & Francis, London, 1990 which is hereby incorporated by reference herein. Further descriptions of atomic and molecular structures and the method of operation are found in copending cases Y0996-069 and Y0997-297.

A method found in the prior art for preparing the device found in FIG. 1 was to grow it on a niobium-doped strontium titanate (Nb—$SrTiO_3$) substrate 106. Niobium doping makes substrate 103 conducting. Substrate 103 is the gate electrode in device 100. A dielectric spacing layer 104, approximately 1800 Angstroms thick was grown epitaxially on substrate 106 by the standard self assembly process of laser ablation single crystal deposition of strontium titanate in a vacuum deposition chamber. It has been determined that in order to obtain good dielectric properties for gate insulator spacing layer 104, (e.g., high breakdown voltage), low leakage and high dielectric constant, deposition must take place in the presence of oxygen. A typical example of same using device 100 would utilize an oxygen pressure of approximately 300 milliTorr. Without removing the device from the laser ablation vacuum deposition chamber, approximately 200 Angstroms thick Mott transition layer channel 105 consisting of cuprate $Y_{0.5}Pr_{0.5}Ba_2Cu_3O_{7-\delta}$ was epitaxially grown on gate insulator 104 with the standard self-assembly process of laser ablation single crystal deposition with partial oxygen pressure (approximately 4 milliTorr) above the device. This enables control of the stoichiometry of Mott transition layer 105, yielding desirable properties, including sheet resistance. Source and drain electrodes were then deposited on top of cuprate Mott transition layer by electron beam evaporation through a contact mask. Source and drain electrodes are typically platinum 50 microns×50 microns, with a thickness of about 2000 Angstroms. Device 100 has a channel length of about 5 microns and a channel width of about 50 microns. The large ratio of the area of the source and drain electrodes compared with the thickness of the cuprate layer allows the electrical conduction to the cuprate Mott transition layer which is at the cuprate/titanate interface.

SUMMARY OF THE INVENTION

The present invention relates to an oxide based, dual gate room temperature transistor device. The first embodiment of the present invention is to form a transistor device which is capable of improved switching between two states of high and low conductivity upon simultaneous application of a suitable gate voltage to both gates. The invention is capable of working in both an enhancement mode and a depletion mode. In particular, the invention relates to field effect transistors (FET) in which the channel of same is made from materials characterized by an electrical conductivity which can undergo an insulator-metal transition (i.e. Mott transition) upon application of an electric field. The device of the present invention uses a channel comprising such a Mott material, in which charge carriers, either holes or electrons, are strongly correlated. The Mott transition determines the metal-insulator switching and has been shown to be controlled by an external gate electrode. (See e.g., "A Field Effect Transistor Based On The Mott Transition In A Molecular Layer," Zhou, et al. *Appl. Phys. Lett.* 70 (5) p.598, (1997); "Mott Transition Field Effect Transistor," Newns, et al., *Appl. Phys. Lett.* 73 (6) p.780, (1998), the contents of which are hereby incorporated by reference herein.)

In the oxide based transistors of the present invention, the ideal situation occurs when the channel layer possesses a high degree of long-range order arising from layer by layer epitaxial growth where there is perfect lattice formation between the substrate and the layer being grown. Such an ideal situation, however, results in strong electric-field screening properties of the transistor channels when in the metallic state. According to the theory of Mott-FET transistors, in, for example an enhancement mode architecture, the change in conductivity occurs mainly in a few atomic layers in the channel material. These are the channel layers that are exposed to the highest absolute value of electrical field inside the material upon application of the gate voltage. By construction, these layers are closest to the interface with the gate insulator. As these layers become conducting they screen the electric field efficiently creating a discontinuity that leaves the other layers in the insulating state. The use of dual gate architecture allows the use of both interfaces therefore improving the performance of the device. It also allows one to obtain the same value of gate conductivity as a single gate device but with a lower absolute value of the applied voltage.

Conversely, in the case of a depletion mode device, the channel in the zero gate field state is highly conducting and therefore capable of efficiently screening the gate electric field. The use of dual gate architecture makes gate electric field modulation of the entire channel more facile therefore improving the performance of the device. It also allows one to obtain the same value of gate conductivity as a single gate device but with a lower absolute value of the applied voltage.

A second embodiment of the present invention is to form a transistor device which is capable of switching between up to four states of different conductivity upon application of sequential voltages to the gates.

The distinctions between the two embodiments are clarified by the following tables. The conductivity possibilities arising applying electric field E1 to gate 1 and E2 to gate 2 in the dual gate device are as follows:

| Gate 1 | Gate 2 | Enhancement | Depletion |
| --- | --- | --- | --- |
| 0 | 0 | 0 | 3' |
| $E_1$ | 0 | 1 | 2' |
| 0 | $E_2$ | 2 | 1' |
| $E_1$ | $E_2$ | 3 | 0' | wherein the magnitude of the conductivity obeys the general rule: −|3, (3')|>|2, (2')|>|1, (1')|>|0, (0')|—. These possible states of conductivity can be achieved with a single voltage source using different voltage levels. These states can also be obtained by making the two oxides of the same material, but constructed of a different thickness; or by making the two oxides of different material but the same thickness or different material and different thickness. In that case the following conductivity states are obtained:

| Gate 1 | Gate 2 | Enhancement | Depletion |
|--------|--------|-------------|-----------|
| 0 | 0 | 0 | 3' |
| V | 0 | 1 | 2' |
| 0 | V | 2 | 1' |
| V | V | 3 | 0' |

The first embodiment occurs in the case when both gates are connected to the same voltage source. Then the result is a two state device (0 and 3) or (3' and 0') with an enhanced conductivity ratio compared to a single gate device. The second embodiment occurs when voltages are applied sequentially to the two gates resulting in the four state devices shown in the tables.

The various features of novelty which characterize the invention are pointed out with particularity in the claims annexed and forming a part of the disclosure. For a better understanding of the invention, its operating advantages, and specific objects attained by its use, reference should be had to the drawing and descriptive matter in which there are illustrated and described preferred embodiments of the invention.

DETAILED DESCRIPTION OF THE PREFERRED EMBODIMENT

The present invention comprises two embodiments of a Mott FET which is capable of switching among three different states consisting of low, medium and high conductivity. These devices provide for production of high density memory devices.

Figure 1:
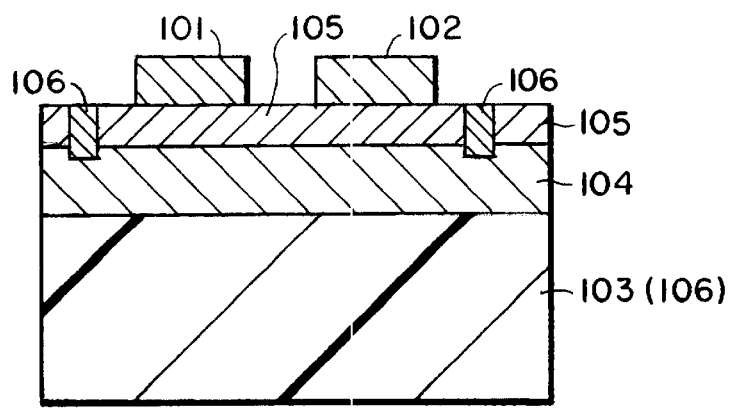
FIG. 1 is a side schematic view of the prior art.
Figure 2:
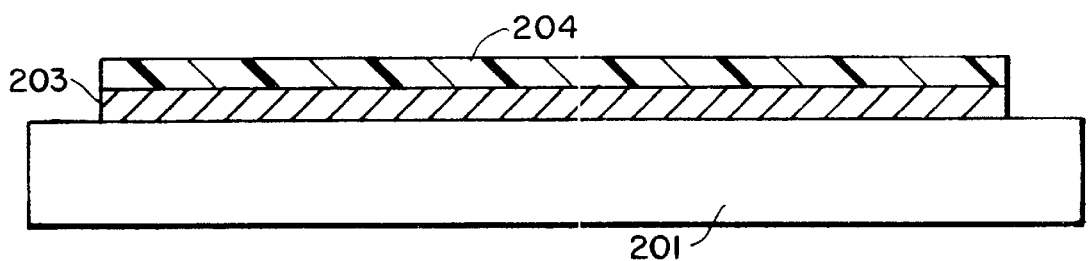
FIG. 2 is a side schematic view of the substrate layers of a first embodiment of the assembly of the present invention.

The process that constitutes the first preferred embodiment of the present invention starts with a clean flat single crystal perovskite oxide substrate 201 (e.g., strontium titanate[STO]) shown in FIG. 2. Additional suitable crystal oxide substrates are $LaAlO_3$, and $SrLaAlO_3$. The process proceeds with the formation of succeeding layers 203, 204. These layers can be grown epitaxially using any number of well-known processes, for example Pulsed Laser Deposition (PLD). Prior to deposition, the substrates were ultrasonically cleaned sequentially in acetone, isopropanol and ethanol. Layer 203 is a conductive oxide, typically and preferably, 10–50 nm of strontium ruthenate (SRO). Layer 204 is the gate insulator, typically an oxide having a high dielectric constant, such as strontium titanate (STO) or barium strontium titanate (BSTO) typically having a thickness about 20–150 in, preferably about 100 nm. It is important to note that the conductive layer should be a metallic oxide of the type mentioned that has a good match with the substrate gate oxide.

Figure 3:
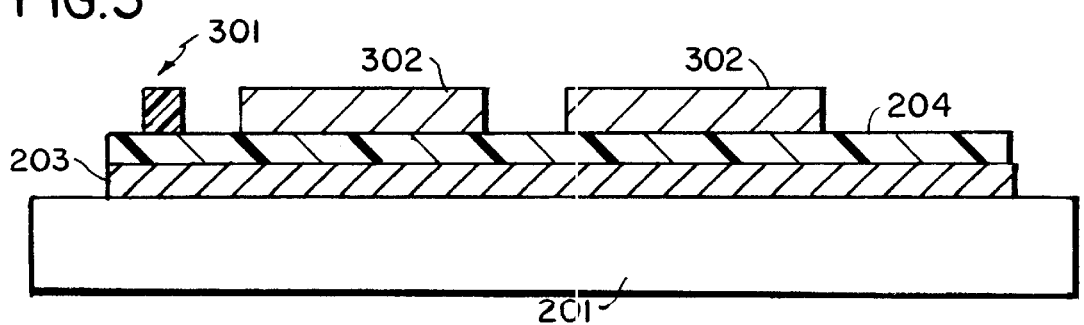
FIG. 3 is a side schematic view of the structure added to the assembly depicted in FIG. 2.

FIG. 3 depicts the results of a deposition, (over the already formed layers), of alignment masks 301 and electrodes 302 for source and drain. This step requires the use of a lithographic mask to define the features, and then metal deposition, preferably and usually Ti/Pt with thickness of 30 and 300 A, by evaporation or sputtering. After lift-off and cleaning, by for example, solvent cleaning (e.g., acetone) in ultrasound followed by mild 0 ash, the assembly of FIG. 3 is reintroduced into the deposition chamber and undergoes annealing.

The annealing process at this stage is important in order to clean the surface and achieve good adhesion of the metal electrodes to the oxide layer thus preventing the formation of disconnected islands during the subsequent high temperature growth of additional layers. In order to prevent the formation of a layer of titanium dioxide which would cause delamination, an alloy is formed by annealing the sample first in vacuum conditions. Later the annealing continues in an oxygen atmosphere in order to restore the oxygen lost from the oxide layers during the previous step.

For the purpose of the description of the present invention, the use of the expression "lithographic" in conjunction with other words shall include the sequence of steps well known in the art for: depositing a photoresist to form a pattern, including laying down a photoresist; forming a mask; exposing through the mask to define the desired features; development of the mask; removal of unwanted defined areas; etching or depositing materials through the mask; lifting off the mask.

Figure 4A:
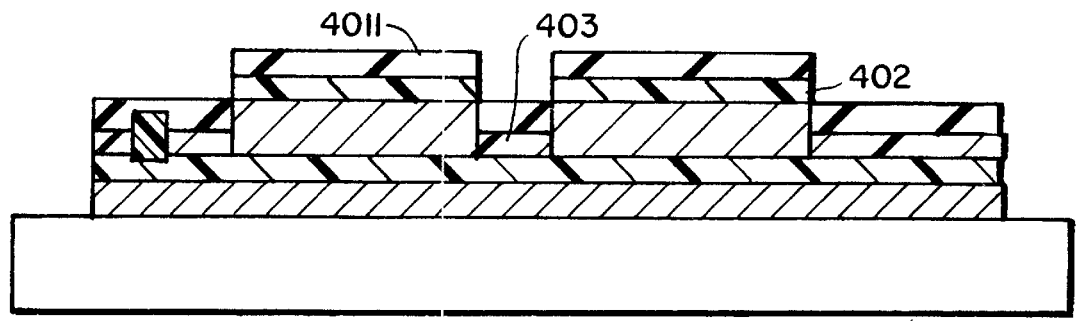
FIG. 4 is a side schematic view of the structure added to the assembly depicted in FIG. 3.
Figure 4B:
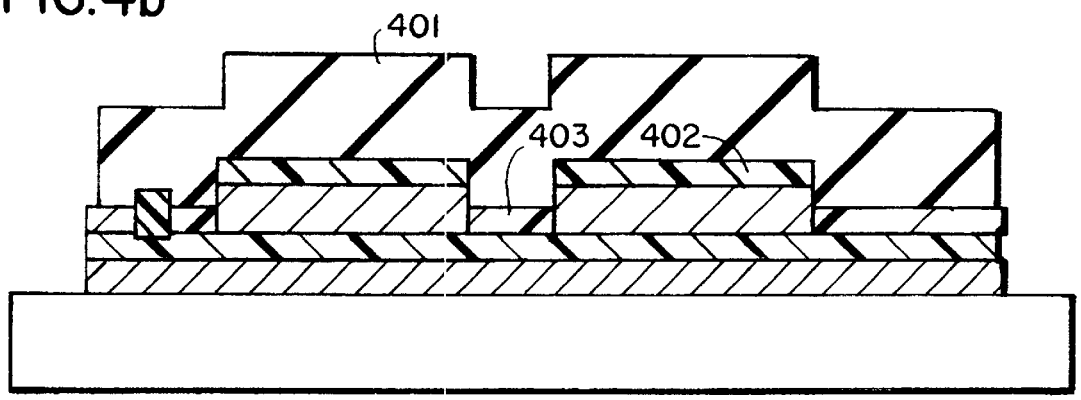
Figure 4C:
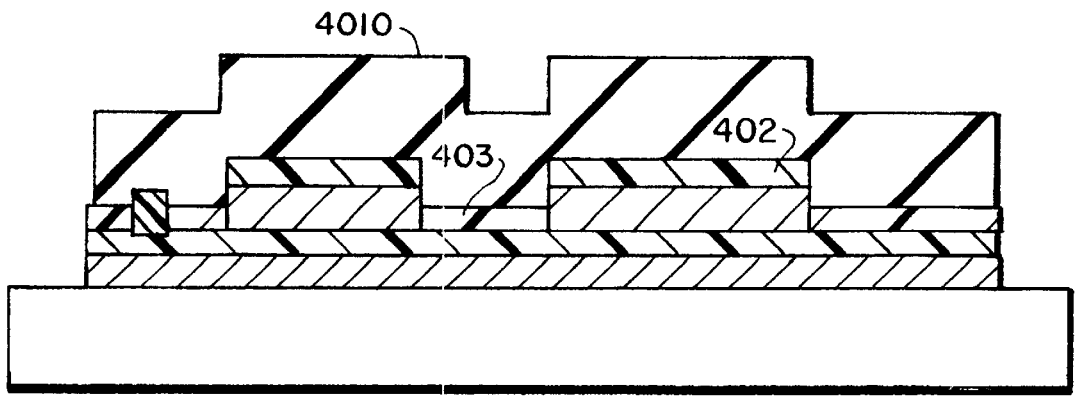

FIG. 4 depicts a layer of Mott-insulator oxide 402 deposited to construct a channel layer. For a P-type channel layer, the preferred compounds are $La_2CuO_4$, (LCO) or $YBa_2Cu_3O_{7-\delta}$ (YBCO) or $Y_{1-x}Pr_xBa_2Cu_3O_{7-\delta}$ (YBPCO). For an N-type channel, $Nd_2CuO$ is typically used. In FIGS. 4a, 4b and 4c, the deposition of a second layer of gate insulator is shown. The latter may have a thickness equal to layer 204, as is shown in FIG. 4a. Alternatively, as is shown in FIG. 4b, the second layer of gate insulator 401, which is $SrTiO_2$, may have a different thickness from that of layer 204. Also, as shown in FIG. 4c, the second layer of gate insulator 401 may be of a material with a different dielectric constant from that of the material comprising layer 201 or of gate insulator 401. The latter may have a different thickness or may be of a material with different dielectric constant than that of layer 204.

Figure 5:
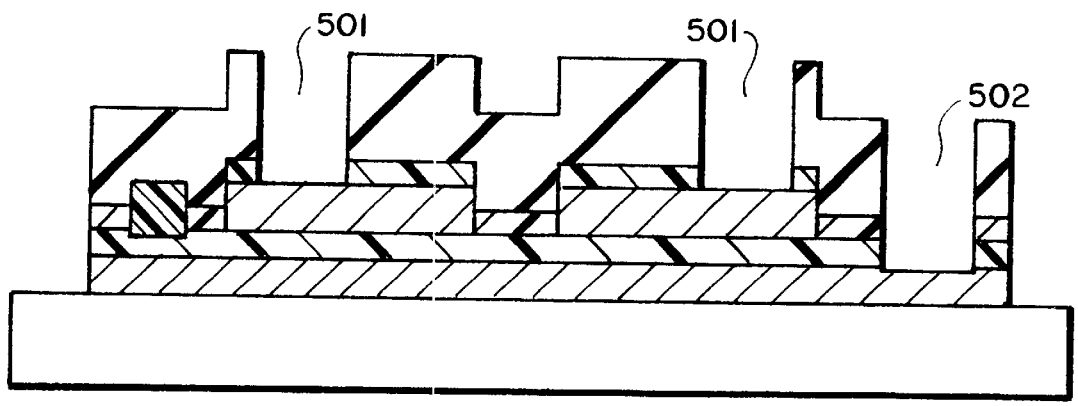
FIG. 5 is a side schematic view of the structure added to the assembly depicted in FIG. 4.

FIG. 5 depicts the opening via holes 501 to contact the source and drain electrodes and via hole 502 to contact conductive layer 203. A lithographic process and dry and/or wet etch process are utilized to form this layer.

Figure 6:
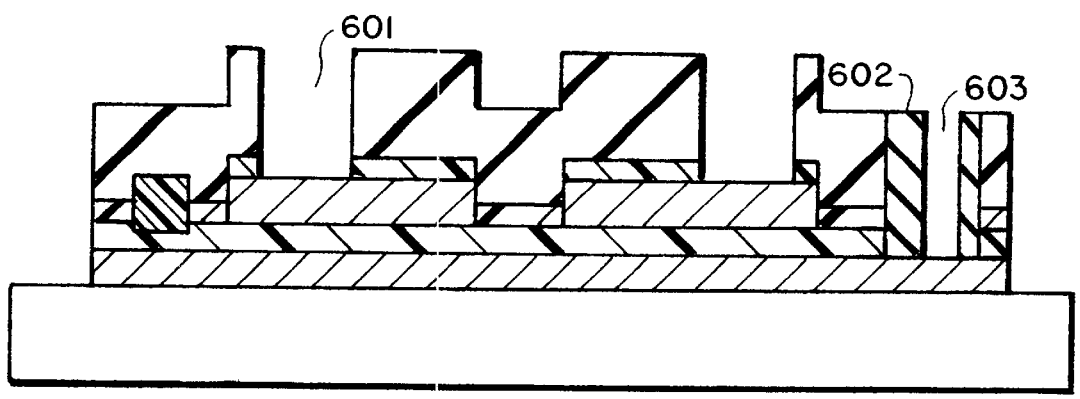
FIG. 6 is a side schematic view of the structure added to the assembly depicted in FIG. 5.

FIG. 6 depicts the filling of the via hole 502 With an insulating material 602, typically tetraethylorthosilicate (TIOS), and the opening of another via hole 603 in the latter material.

Figure 7:
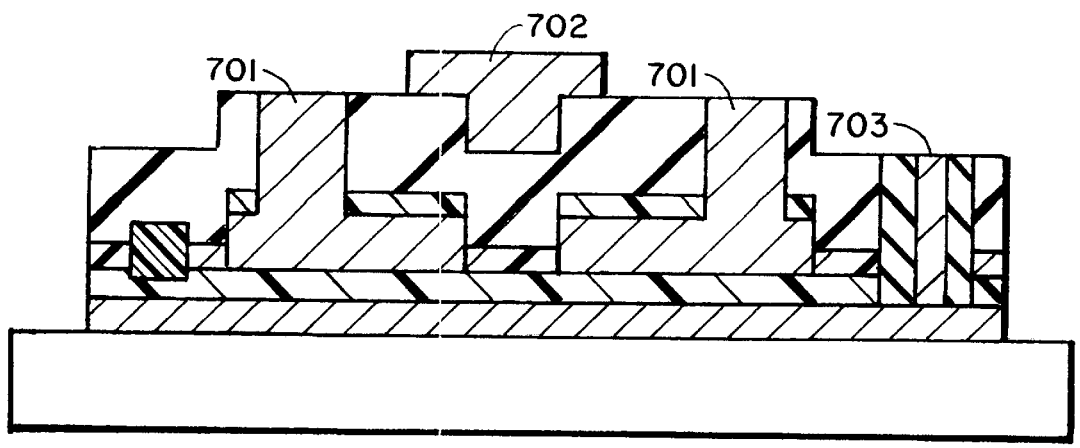
FIG. 7 is a side schematic view of the structure added to the assembly depicted in FIG. 6.

FIG. 7 depicts the metallization 701 of the source and gate contacts, 702 for the second gate, and metallic connection 703 to the first gate, which has been defined by the conductive oxide.

Figure 8:
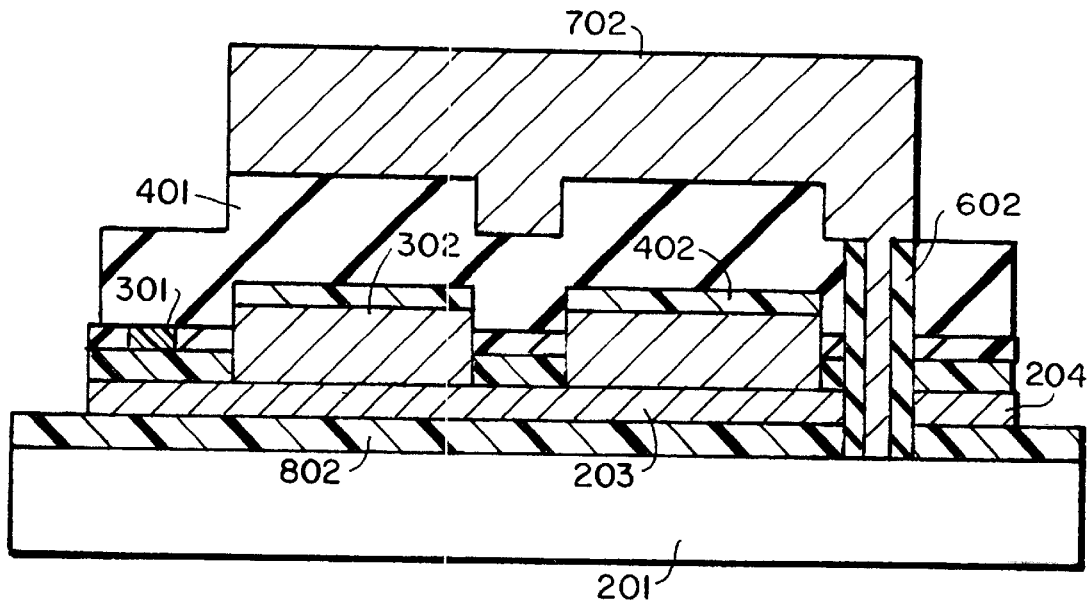
FIG. 8 is a side schematic view of the basic structure of a second embodiment of the assembly of the present invention.
Figure 9:
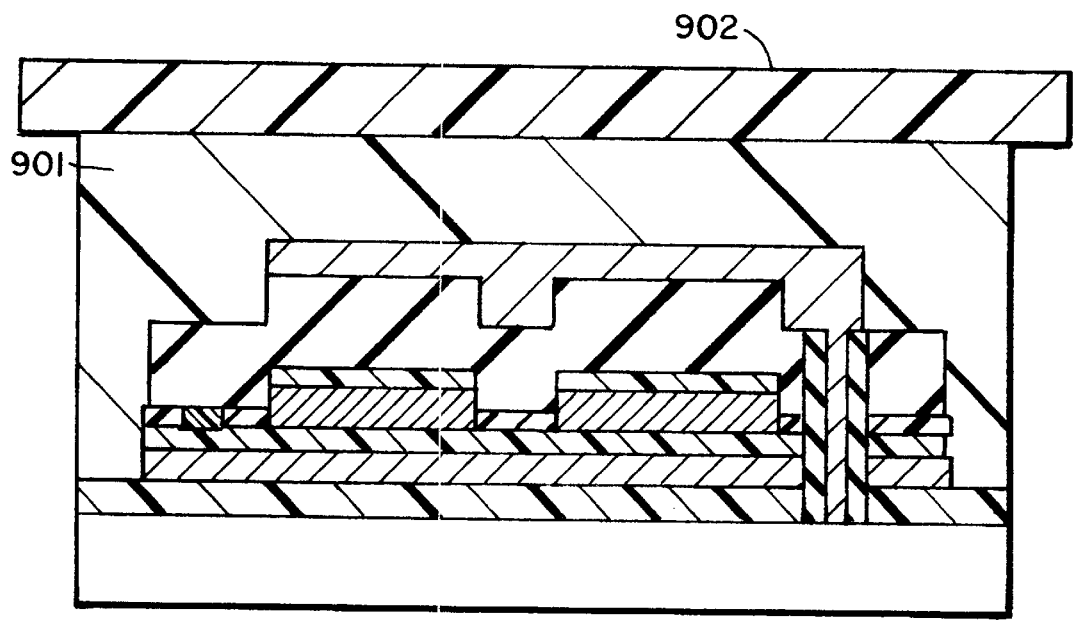
FIG. 9 is a side schematic view of the structure added to the assembly depicted in FIG. 8.
Figure 10:
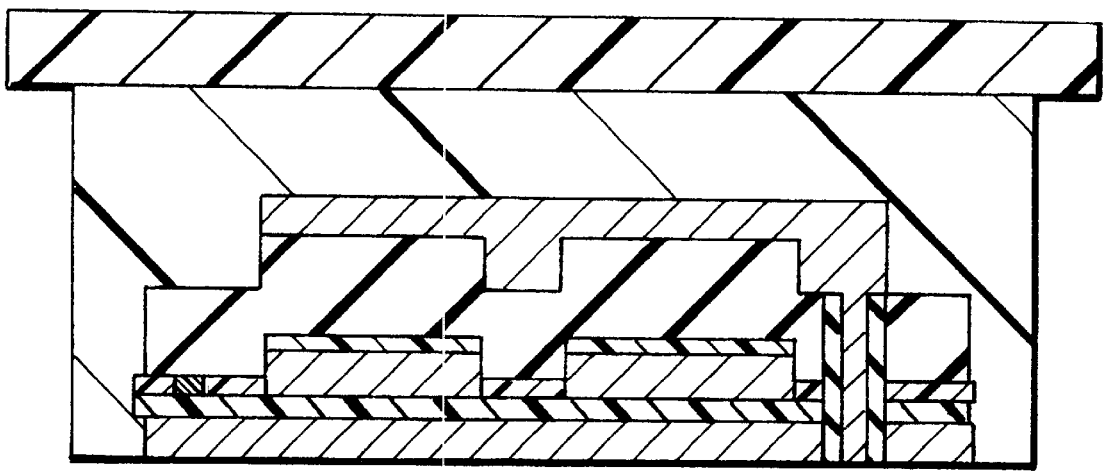
FIG. 10 is a side schematic view of the structure added to the assembly depicted in FIG. 9.
Figure 11:
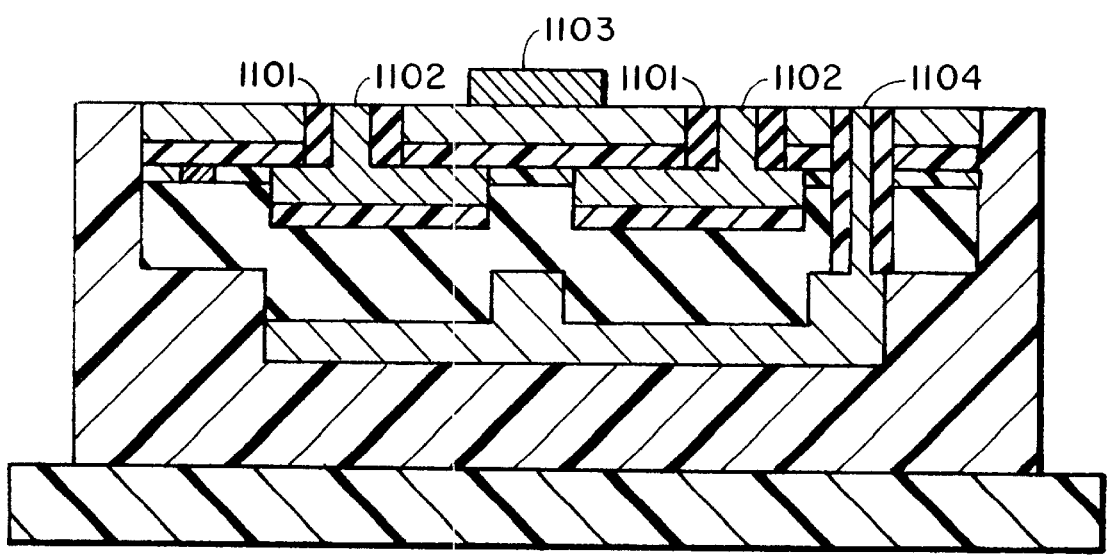
FIG. 11 is a side schematic view of structure added to the assembly depicted in FIG. 10.

The second embodiment is depicted in FIGS. 8–11. This embodiment is characterized by a structure similar to the structure depicted in FIGS. 2–7, with the initial addition of a release layer 802, typically YBCO, and the extension of vias 702 and 602 through the SRO layer. Once the structure depicted in FIG. 8 is completed, a binder 901, such as benzocyclobutene (BCB), or a wax, is then deposited over the structure as depicted in FIG. 9. A suitable "top-substrate" 902, such as a rigid or flexible substrate, is then attached to the structure. The release layer and substrate 201 are then removed from the structure, as shown in FIG. 10, using, for example, a dilute solution of HCl, which does not attack SRO. The complete device is depicted in FIG. 11, with the via holes filled with TIOS 1101 and secondary vias filled with Pt, 1102, to effect contact to the source and drain electrodes. Also shown in FIG. 11 is the first gate electrode 1103 and the contact to the second gate 1104.

The invention demonstrated herein is a novel device similar in architect to a conventional silicon FET, but with a channel consisting of a material capable of undergoing a Mott metal-insulator transition. The two general designs were test and demonstrated, and both showed significant gate-field induced channel conductivity changes. The devices have properties that are consistent with the picture of cuprate property leading to the Mott transition in these materials.

Thus, while there have been shown and described and pointed out, fundamental novel features of the invention as applied to currently preferred embodiments thereof, it will be understood that various omissions and substitutions and changes in, for example, details of the method and article illustrated, and in the operation thereof, may be made by those skilled in the art without departing from the spirit of the invention. In addition, it is to be understood that the drawings are not necessarily drawn to scale, but that they are merely conceptual in nature. It is the intention, therefore, to be limited only as indicated by the scope of the claims.

What we claim and desire to protect by Letters Patent is:

1. A dual gate oxide channel field effect transistor assembly comprising:
   a crystal oxide substrate;
   a first layer comprising a conductive oxide which in said assembly forms a first gate electrode in continuous contact with said substrate;
   a second layer comprising a gate insulator formed from an oxide which in said assembly forms a first gate oxide, said second layer being aligned in continuous contact with said first layer;
   source and drain electrodes situated in contact with said second layer;
   said source and drain electrodes each having an upper surface and side areas which are in contact with a third layer comprising a Mott-material oxide layer which in said assembly forms a channel;
   the exposed surfaces of said Mott-material layer and the remaining non-contacted sides of said source and drain electrodes being enveloped by a fourth layer comprising a second gate insulator material;
   a second gate electrode in contact with said second gate insulator material;
   said assembly having a plurality of vias to contact said source and drain electrodes and a plurality of vias to contact said conductive oxide layer.

2. The dual gate oxide channel field effect transistor assembly defined in claim 1 wherein said gate electrodes are electrically connected to each other.

3. The dual gate oxide channel field effect transistor assembly defined in claim 1 wherein said gate electrodes are electrically isolated from each other thereby allowing up to four states of different channel conductivity.

4. A dual gate oxide channel field effect transistor assembly comprising:
   a first layer comprising a conductive oxide which in said assembly forms a first gate electrode;
   a second layer comprising a gate insulator formed from an oxide which in said assembly forms a first gate oxide, said second layer being aligned in continuous contact with said first layer;
   source and drain electrodes situated in contact with said second layer and said source and drain electrodes having a surface and side areas which are in contact with a third layer comprising a Mott-material oxide layer which in said assembly forms said channel;
   the exposed surfaces of said Mott-material layer and the remaining sides of said source and said drain electrodes being enveloped by a fourth layer comprising a second gate insulator material;
   and a second gate electrode in contact with said second gate insulator;
   said assembly having a plurality of vias to contact said source and drain electrodes and a plurality of vias to contact said second gate electrode;
   said assembly enveloped by a binder and supported by a substrate.

5. The dual gate oxide channel field effect transistor assembly defined in claim 4 wherein said gate electrodes are electrically connected to each other.

6. The dual gate oxide channel field effect transistor assembly defined in claim 4 wherein said gate electrodes are electrically isolated from each other thereby allowing up to four states of different channel conductivity.

7. The dual gate oxide channel field effect transistor assembly defined in claim 2 wherein said first gate insulator and said second gate insulator have the same thickness and the same composition.

8. The dual gate oxide channel field effect transistor assembly defined in claim 2 in which said first and said second gate insulators are the same composition and are of a different thickness.

9. The dual gate oxide channel field effect transistor assembly defined in claim 2 in which said first and said second gate insulators are formed from a different composition and have the same thickness.

10. The dual gate oxide channel field effect transistor assembly defined in claim 2, in which said first and said second gate insulators have different compositions and different thickness.

11. The dual gate oxide channel field effect transistor assembly defined in claim 3 in which said first and said second gate insulators are the same composition and are of a different thickness.

12. The dual gate oxide channel field effect transistor assembly defined in claim 3 in which said first and said second gate insulators are formed from a different composition and have the same thickness.

13. The dual gate oxide channel field effect transistor assembly defined in claim 3, in which said first and said second gate insulators have different compositions and different thickness.

14. The dual gate oxide channel field effect transistor assembly defined in claim 5 wherein said first gate insulator and said second insulator have the same thickness and the same composition.

15. The dual gate oxide channel field effect transistor assembly defined in claim 5 in which said first and said second gate insulators are the same composition and are of a different thickness.

16. The dual gate oxide channel field effect transistor assembly defined in claim 5 in which said first and said second gate insulators are formed from a different composition and have the same thickness.

17. The dual gate oxide channel field effect transistor assembly defined in claim 5, in which said first and said second gate insulators have different compositions and different thickness.

18. The dual gate oxide channel field effect transistor assembly defined in claim 6 in which said first and said second gate insulators are the same composition and are of a different thickness.

19. The dual gate oxide channel field effect transistor assembly defined in claim 6 in which said first and said second gate insulators are formed from a different composition and have the same thickness.

20. The dual gate oxide channel field effect transistor assembly defined in claim 6, in which said first and said second gate insulators have different compositions and different thickness.

21. The dual gate oxide channel FET assembly defined in claim 3 in which said first gate insulator and said second gate insulator have the same thickness and the same composition, and where said first gate electrode and said second gate electrode are switched with different voltages.

22. The dual gate oxide channel FET assembly defined in claim 11 in which said first gate electrode and said second gate electrode are switched with different voltages.

23. The dual gate oxide channel FET assembly defined in claim 12 in which said first gate electrode and said second gate electrode are switched with different voltages.

24. The dual gate oxide channel FET assembly defined in claim 13 in which said first gate electrode and said second gate electrode are switched with different voltages.

25. The dual gate oxide channel FET assembly defined in claim 6 in which said first gate insulator and said second gate insulator have the same thickness and the same composition, and where said first gate electrode and said second gate electrode are switched with different voltages.

26. The dual gate oxide channel FET assembly defined in claim 18 in which said first gate electrode and said second gate electrode are switched with different voltages.

27. The dual gate oxide channel FET assembly defined in claim 19 in which said first gate electrode and said second gate electrode are switched with different voltages.

28. The dual gate oxide channel FET assembly defined in claim 20 in which said first gate electrode and said second gate electrode are switched with different voltages.

29. The dual gate oxide channel field effect transistor assembly defined in claim 1, in which said crystal oxide substrate is selected from the group consisting of $SrTiO_3$, $LaAlO_3$ and $SrLaAlO_4$.

30. The dual gate oxide channel field effect transistor assembly defined in claim 4, in which said crystal oxide substrate is selected from the group consisting of $SrTiO_3$, $LaAlO_3$ and $SrLaAlO_4$.

31. The dual gate oxide channel field effect transistor assembly defined in claim 1, in which said conductive oxide is $SrRuO_3$.

32. The dual gate oxide channel field effect transistor assembly defined in claim 4, in which said conductive oxide is $SrRuO_3$.

33. The dual gate oxide channel field effect transistor assembly defined in claim 1, in which said gate oxides are selected from the group consisting of strontium titanate and barium strontium titanate.

34. The dual gate oxide channel field effect transistor assembly defined in claim 4, in which said gate oxides are selected from the group consisting of strontium titanate and barium strontium titanate.

35. The dual gate oxide channel field effect transistor assembly defined in claim 1, in which said Mott metal channel layer is selected from the group consisting of $La_2CuO_4$, $Y_1Ba_2Cu_3O_{7-\delta}$, $Nd_2CuO_4$, $La_{2-x}Sr_xCuO_4$, $La_2Ni_{1-x}Cu_xO_4$ and $Y_{1-x}Pr_xBa_2C_3O_{7-\delta}$.

36. The dual gate oxide channel field effect transistor assembly defined in claim 4, in which said Mott metal channel layer is selected from the group consisting of $La_2CuO_4$, $Y_1Ba_2Cu_3O_{7-\delta}$, $Nd_2CuO_4$, $La_{2-x}Sr_xCuO_4$, $La_2Ni_{1-x}Cu_xO_4$ and $Y_{1-x}Pr_xBa_2Cu_3O_{7-\delta}$.

37. The dual gate oxide channel field effect transistor assembly defined in claim 1, in which said source and drain electrodes and said gate are selected from the group consisting of Pt, Au, Cr, Al, $SrRuO_3$, Pt/Ti, Au/Ti, Cr/Ti and Al/Ti, Pt/Cr and combinations thereof.

38. The dual gate oxide channel field effect transistor assembly defined in claim 4, in which said source and drain electrodes and said gate are selected from the group consisting of Pt, Au, Cr, Al, $SrRuO_3$, Pt/Ti, Au/Ti, Cr/Ti and Al/Ti, Pt/Cr and combinations thereof.

39. The dual gate oxide channel field effect transistor assembly defined in claim 1, in which said gate oxides are selected from the group consisting of strontium titanate and barium strontium titanate;

said Mott metal channel layer is selected from the group consisting of $La_2CuO_4$, $Y_1Ba_2Cu_3O_{7-\delta}$, $Nd_2CuO_4$, $La_{2-x}Sr_xCuO_4$, $La_2Ni_{1-x}Cu_xO_4$ and $Y_{1-x}Pr_xBa_2C_3O_{7-\delta}$ and said source and drain electrodes and said gate are selected from the group consisting of Pt, Au, Cr, Al, $SrRuO_3$, Pt/Ti, Au/Ti, Cr/Ti and Al/Ti, Pt/Cr and combinations thereof.

40. The dual gate oxide channel field effect transistor assembly defined in claim 4, in which said gate oxides are selected from the group consisting of strontium titanate and barium strontium titanate;

said Mott metal channel layer is selected from the group consisting of $La_2CuO_4$, $Y_1Ba_2Cu_3O_{7-\delta}$, $Nd_2CuO_4$, $La_{2-x}Sr_xCuO_4$, $La_2Ni_{1-x}Cu_xO_4$ and $Y_{1-x}Pr_xBa_2C_3O_{7-\delta}$ and said source and drain electrodes and said gate are selected from the group consisting of Pt, Au, Cr, Al, $SrRuO_3$, Pt/Ti, Au/Ti, Cr/Ti and Al/Ti, Pt/Cr and combinations thereof.

* * * * *